(12) United States Patent
Chan et al.

(10) Patent No.: US 7,129,548 B2
(45) Date of Patent: Oct. 31, 2006

(54) MOSFET STRUCTURE WITH MULTIPLE SELF-ALIGNED SILICIDE CONTACTS

(75) Inventors: Kevin K. Chan, Staten Island, NY (US); Christian Lavoie, Ossining, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/916,201

(22) Filed: Aug. 11, 2004

(65) Prior Publication Data

US 2006/0033165 A1 Feb. 16, 2006

(51) Int. Cl.
*H01L 29/94* (2006.01)

(52) U.S. Cl. .................. 257/382; 257/384; 257/336; 257/344; 257/342; 257/E21.439; 257/E29.156

(58) Field of Classification Search ............. 257/342, 257/368, 336, 344, 412, 408, 382
See application file for complete search history.

(56) References Cited

U.S. PATENT DOCUMENTS

| | | | |
|---|---|---|---|
| 5,841,173 | A | 11/1998 | Yamashita et al. |
| 6,063,681 | A | 5/2000 | Son et al. |
| 6,242,776 | B1 | 6/2001 | Hause et al. |
| 6,642,119 | B1 * | 11/2003 | Pelella et al. ............... 438/303 |
| 2002/0008295 | A1 * | 1/2002 | Yang et al. ................. 257/413 |
| 2002/0137268 | A1 * | 9/2002 | Pellerin et al. ............. 438/197 |
| 2002/0142524 | A1 * | 10/2002 | En et al. ..................... 438/151 |
| 2003/0162359 | A1 | 8/2003 | Yang et al. |
| 2003/0183881 | A1 * | 10/2003 | Lee et al. ................... 257/382 |
| 2004/0063289 | A1 * | 4/2004 | Ohta .......................... 438/303 |
| 2004/0256671 | A1 * | 12/2004 | Huang et al. ............... 257/344 |
| 2005/0040472 | A1 * | 2/2005 | Oh et al. .................... 257/382 |

FOREIGN PATENT DOCUMENTS

WO 02/082503 10/2002

* cited by examiner

*Primary Examiner*—Jerome Jackson
*Assistant Examiner*—Paul Budd
(74) *Attorney, Agent, or Firm*—Scully, Scott, Murphy & Presser, P.C.; Wan Yee Cheung, Esq.

(57) ABSTRACT

A metal oxide semiconductor field effect transistor (MOSFET) structure that includes multiple and distinct self-aligned silicide contacts and methods of fabricating the same are provided. The MOSFET structure includes at least one metal oxide semiconductor field effect transistor having a gate conductor including a gate edge located on a surface of a Si-containing substrate; a first inner silicide having an edge that is substantially aligned to the gate edge of the at least one metal oxide semiconductor field effect transistor; and a second outer silicide located adjacent to the first inner silicide. In accordance with the present invention, the second outer silicide has second thickness is greater than the first thickness of the first inner silicide. Moreover, the second outer silicide has a resistivity that is lower than the resistivity of the first inner silicide.

14 Claims, 7 Drawing Sheets

MOSFET STRUCTURE WITH MULTIPLE SELF-ALIGNED SILICIDE CONTACTS

FIELD OF THE INVENTION

The present invention relates to a semiconductor structure, and more particularly to a metal oxide semiconductor field effect transistor (MOSFET) structure that contains multiple self-aligned silicide contacts. The present invention also provides methods for fabricating such a MOSFET structure.

BACKGROUND OF THE INVENTION

As metal oxide semiconductor field effect transistors (MOSFETs) scale down in size, higher performance can be achieved by bringing metal silicide contacts closer to the gate conductor. There are difficulties however in forming self-aligned metal silicide contacts close to the gate conductor edge. For example, relatively thick silicides (on the order of about 20 nm or greater), which are required to meet sheet resistivity in the diffusion and polycide, will consume silicon and can interfere with the integrity of an ultra shallow junction that is typically present near the gate edge under the spacer.

For ultra-thin body MOSFETs in which the device channel has a thickness of about 20 nm or less, the thickness of the silicon available to form a silicide contact is limited. So-called raised source/drain regions (RSD, or also called elevated source/drain regions) can mitigate this problem. However, RSD regions that are positioned close to the gate conductor edge will increase the capacitance between the gate and the source/drain regions.

In view of the above, there is a need for providing a MOSFET structure having self-aligned metal silicide contacts that are close to the gate conductor edge that do not consume sufficient silicon such that the integrity of the ultra shallow junction is not effected. Moreover, a MOSFET structure is needed in which the silicide located in proximity to the gate conductor edge does not increase the capacitance between the gate and the source/drain regions.

SUMMARY OF THE INVENTION

The present invention provides a solution to the problems mentioned in the background section of this application by utilizing two or more distinct regions of silicide. Specifically, the present invention provides a MOSFET structure that includes a silicide that is located outside of a gate spacer that is thick and of low resistivity, as is required for low resistivity local interconnects. Near the gate conductor edge and typically under the gate spacer, another silicide is provided that has a thickness that is less than the outer silicide. The thinner silicide has a higher resistivity than the thick outer silicide. The thinner silicide does not consume too much silicon during the processing thus avoiding the problems mentioned above.

Specifically, and in broad terms, the present invention provides a MOSFET structure that comprises:

at least one metal oxide semiconductor field effect transistor located on a surface of a Si-containing substrate, said at least one metal oxide semiconductor field effect transistor comprises at least a gate conductor having a gate edge;

a first inner silicide contact having an edge that is substantially aligned to the gate edge of the at least one metal oxide semiconductor field effect transistor, said first inner silicide contact having a first thickness and a first resistivity; and a second outer silicide contact located adjacent to, i.e., self-aligned with, said first inner silicide contact, said second outer silicide contact having a second thickness and a second resistivity, wherein said second thickness is greater than the first thickness and second resistivity is lower than the first resistivity.

In addition to the MOSFET structure described above that includes multiple and distinct self-aligned silicide contacts, i.e., first inner silicide contact and second outer silicide contact, the present invention also provides methods of fabricating such a structure. A first method that is provided by the present invention comprises the steps of:

providing at least one metal oxide semiconductor field effect transistor comprising at least a gate conductor having a gate edge on a surface of a Si-containing substrate, said gate edge including at least a wide spacer;

forming an outer silicide contact aligned to an outer edge of said wide spacer;

removing said wide spacer to expose a portion of said Si-containing substrate adjacent to said at least one metal oxide semiconductor field effect transistor; and forming an inner silicide contact in said exposed portion of said semiconductor substrate, said inner silicide contact has an edge aligned to the gate edge, wherein said outer silicide contact has a thickness that is greater than the inner silicide contact and said outer silicide contact has a resistivity that is lower than the resistivity of the inner silicide contact.

A second method that is provided by the present invention differs from the first in that the inner silicide contact is formed prior to the outer silicide contact. Specifically, the second method of the present invention comprises the steps of:

providing at least one metal oxide semiconductor field effect transistor comprising at least a gate conductor having a gate edge on a surface of a Si-containing substrate;

forming an inner silicide contact that is aligned to said gate edge;

forming a wide spacer atop a portion of said inner silicide contact that is located close to said gate edge; and forming an outer silicide contact on a portion of said inner silicide contact that is not protected by said wide spacer, wherein said outer silicide contact has a thickness that is greater than the inner silicide contact and said outer silicide contact has a resistivity that is lower than the resistivity of the inner silicide contact.

DETAILED DESCRIPTION OF THE INVENTION

Figure 1A:
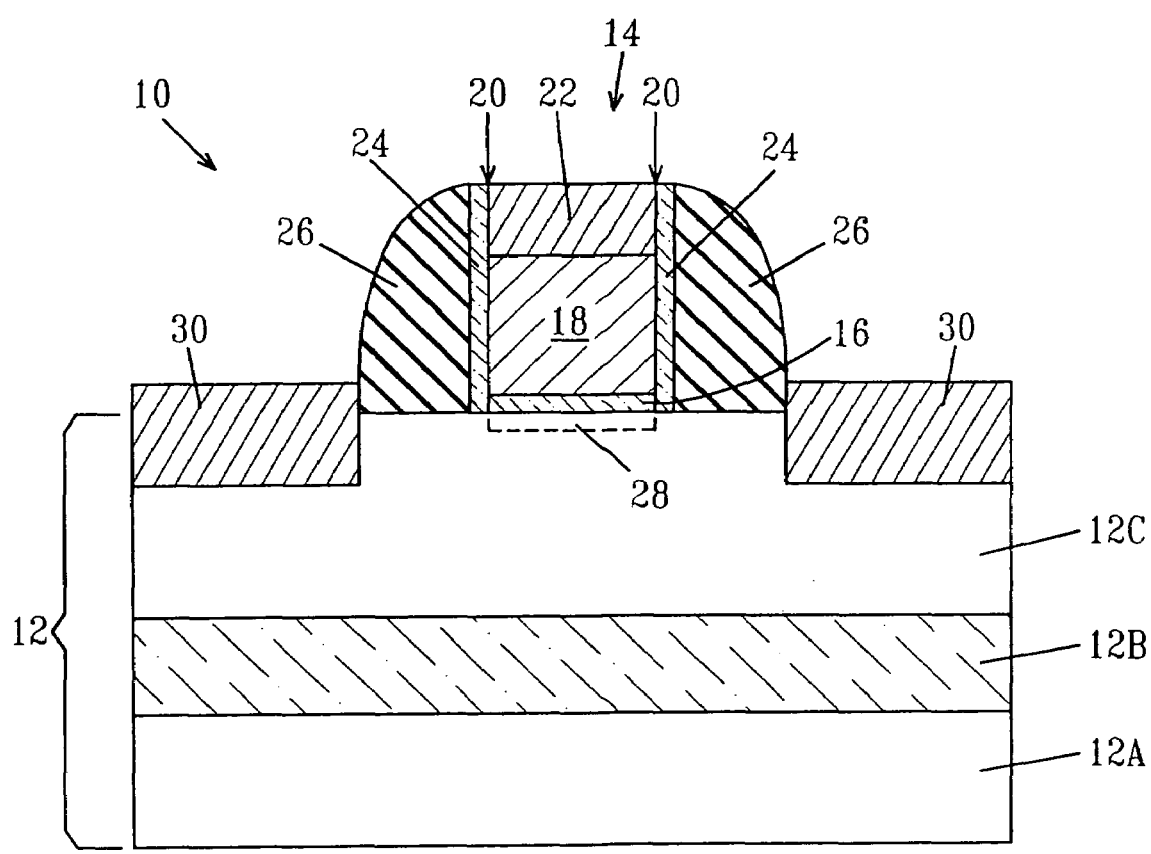
FIGS. 1A–1D are pictorial representations (through cross sectional views) illustrating the basic processing steps employed in a first embodiment of the present invention.

The present invention, which provides a MOSFET structure that includes multiple and distinct self-aligned silicide contacts and methods of fabricating the same, will now be described in greater detail by referring to the drawings that accompany the present application. It is observed that the drawings of the present invention are provided for illustrative purposes and are thus not drawn to scale. Moreover, in the drawings, like and/or corresponding elements are referred to by like reference numerals. Also, despite depicting the formation of a single MOSFET on the substrate, the methods of the present invention can be used in forming a plurality of MOSFETs on the substrate.

Reference is first made to FIGS. 1A–1D which illustrate a first method of the present invention. In the first method of the present invention, the thicker outer silicide contact is formed first prior to the formation of the thinner inner silicide contact. This method of the present invention begins with providing the structure 10 shown in FIG. 1A. The structure 10 comprises a Si-containing substrate 12 and at least one MOSFET 14 located on a surface of the Si-containing substrate 12. The at least one MOSFET 14 includes a gate dielectric 16, a gate conductor 18 having a gate edge 20, optional narrow inner spacer 24, and wide spacer 26. The MOSFET 14 also include channel region 28 that is located beneath the MOSFET 14 in the Si-containing substrate 12. The structure 10 also includes source/drain regions (not labeled) that are located in the Si-containing substrate 12 and outer silicide contacts 30 that have an edge that is self-aligned to the edge of the wide spacer 26. Optional silicide region 22 can be formed atop the gate conductor, if the gate conductor is comprised of polysilicon and no dielectric cap is positioned thereon during the salicidation process.

The Si-containing substrate 12 of the structure 10 shown in FIG. 1A comprises any semiconductor material that includes silicon. Illustrative examples of Si-containing materials that can be employed as the Si-containing substrate 12 include, but are not limited to: Si, SiGe, SiC, SiGeC, and layered semiconductors such as Si/SiGe, a silicon-on-insulator (SOI) or a SiGe-on-insulator (SGOI). The Si-containing substrate 12 may comprise any crystallographic orientation including, for example, (111), (100) or (110). The Si-containing substrate 12 may be doped, undoped or contain doped and undoped regions therein.

Specifically, the Si-containing substrate 12 shown in FIG. 1A is a SOI substrate which includes a semiconductor substrate 12A, a buried insulating layer, such as an oxide, 12B and a top Si-containing layer 12C. The SOI substrate can be made by a layer transfer process or by SIMOX (separation of silicon by ion implantation of oxygen). The thickness of the various layers of the SOI substrate can vary. Typically, the Si-containing layer 12C has a thickness from about 10 to about 180 nm and the buried insulating layer 12B has a thickness from about 10 to about 200 nm.

Although not shown, isolation regions are typically present in the Si-containing substrate 12. The isolation regions are located to the periphery of the device region shown in the drawings of the present application. The isolation regions may be trench isolation regions or field oxide isolation regions. The isolation regions are formed by conventional techniques well known to those skilled in the art. For example, trench isolation regions are formed utilizing a conventional trench isolation process which includes the steps of: lithography, etching, and filling of a trench that is defined by the lithography and etching steps with a trench dielectric material such as $SiO_2$, tetraethylorthosilicate (TEOS) or a high density plasma oxide. Optionally, a liner may be formed in the trench prior to trench fill. Other optional steps include a densification process and a planarization process, such as chemical mechanical polishing (CMP), which are performed after the trench fill. The field oxide regions are formed utilizing a so-called local oxidation of silicon (LOCOS) process.

After forming the isolation regions within the Si-containing substrate 12, gate dielectric 16 is formed on the entire surface of the structure including the Si-containing substrate 12 and atop the isolation regions, if it is a deposited dielectric. The gate dielectric 16 can be formed by a thermal growing process such as, for example, oxidation, nitridation or oxynitridation. Alternatively, the gate dielectric 16 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 16 may also be formed utilizing any combination of the above processes.

The gate dielectric 16 is comprised of an insulating material including, but not limited to: an oxide, nitride, oxynitride and/or silicate. In one embodiment, it is preferred that the gate dielectric 16 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 16 may vary, but typically, the gate dielectric 16 has a thickness from about 0.5 to about 10 nm, with a thickness from about 0.5 to about 3 nm being more typical.

After forming the gate dielectric 16, a blanket layer of a gate conductor 18 is formed on the gate dielectric 16 utilizing a known deposition process such as, for example, physical vapor deposition, CVD, sputtering, plating, chemical solution deposition or evaporation. The gate conductor 18 comprises any conductive material that is typically employed as a gate electrode in a MOSFET device. Illustratively, the blanket layer of gate conductor 18 may comprise polysilicon, a metal, a metal nitride, a metal silicide or a combination thereof. A diffusion barrier, not shown, that is resistant to metal diffusion, such as TiN or TaN, can be formed between each gate conductor 18 when a multilayer stack is employed. The blanket layer of gate conductor 18 may be doped or undoped. If doped polysilicon is employed, an in-situ doping deposition process may be employed in forming the same. Alternatively, a doped polySi layer can be formed by deposition, ion implantation and annealing. The doping of the gate conductor 18 will shift the workfunction of the gate. Illustrative examples of dopant ions include As, P, B, Sb, Bi, In, Al, Ga, Tl or mixtures thereof. The thickness, i.e., height, of the gate conductor 18 deposited at this point of the present invention may vary depending on the deposition process employed. Typically, the gate conductor 18 has a vertical thickness from about 20 to about 180 nm, with a thickness from about 40 to about 150 nm being more typical.

After deposition of the blanket layer of gate conductor 18, a dielectric cap layer (not shown) is typically, but not always, formed atop the blanket layer of gate conductor 18 utilizing a deposition process such as, for example, physical vapor deposition or chemical vapor deposition. The dielectric cap layer may be an oxide, nitride, oxynitride or any combination thereof. In one embodiment, a nitride such as, for example, $Si_3N_4$, is employed as the dielectric cap layer. The thickness, i.e., height, of the dielectric cap layer is from about 20 to about 180 nm, with a thickness from about 30 to about 140 nm being more typical.

The gate conductor 18 and optional dielectric cap layer are then patterned by lithography and etching so as to provide at least one patterned gate stack on the Si-containing substrate 12. The patterned gate conductor includes a gate edge 20, as shown in FIG. 1A. Each patterned gate stack formed may have the same dimension, i.e., length, or they can have variable dimensions to improve device performance. The lithography step includes applying a photoresist to the upper surface of the optional dielectric cap layer, exposing the photoresist to a desired pattern of radiation and developing the exposed photoresist utilizing a conventional resist developer. The pattern in the photoresist is then transferred to the optional dielectric cap layer and the blanket layer of gate conductor 18 utilizing one or more dry etching steps. In some embodiments, the patterned photoresist may be removed after the pattern has been transferred into the optional dielectric cap layer. In other embodiments, the patterned photoresist is removed after etching has been completed.

Suitable dry etching processes that can be used in the present invention in forming the patterned gate stack include, but are not limited to: reactive ion etching, ion beam etching, plasma etching or laser ablation. The dry etching process employed is typically selective to the underlying gate dielectric 16 therefore this etching step does not typically remove the gate dielectric material. In some embodiments, this etching step may however be used to remove portions of the gate dielectric 16 that are not protected by the gate stack. The latter is the case illustrated in the drawings of the present application. This etch may also remove the dielectric cap layer atop the gate conductor 18.

Next, optional inner narrow spacer 24 is formed followed by the formation of wide outer spacer 26. The optional inner narrow spacer 24 and the wide outer spacer 26 are comprised of an insulator such as an oxide, nitride, or oxynitride. The spacers are formed on the exposed sidewalls of the patterned gate stack previously formed by deposition and etching. The narrow spacer 24 can also be formed by a thermal growing process as well. FIG. 1A shows an embodiment of the present invention in which two spacers are formed on each exposed sidewall of the previously formed gate stack. In particular, FIG. 1A shows a structure including the narrow inner spacer 24 having a first width and the wide outer spacer 26 having a second width wherein the first width is narrower than the second width. In another embodiment, the two spacer scheme is replaced by a single spacer in which the single spacer is a wide spacer having a width that is substantially equal to the sum of the first and second widths shown in FIG. 1A.

When both spacers are used, the narrow inner spacer 24 and the wide outer spacer 26 are composed of different insulators. For example, the inner spacer 24 may be comprised of $SiO_2$ and the outer spacer 26 may be comprised of $Si_3N_4$.

The width of the spacers must be sufficiently wide enough such that the outer silicide contact (to be subsequently formed) does not encroach underneath the edge 20 of the gate conductor 18. Typically, the outer silicide does not encroach underneath the edge 20 of the gate conductor 18 when the spacer(s) (26 and optionally 24) has a width, as measured at the bottom, from about 20 to about 80 nm.

After spacer formation, source/drain diffusion regions (not specifically shown) are formed into the substrate. The source/drain diffusion regions are formed utilizing ion implantation and an annealing step. The annealing step serves to activate the dopants that were implanted by the previous implant step. The conditions for the ion implantation and annealing are well known to those skilled in the art.

Next, and if not previously removed, the exposed portion of the gate dielectric 16 is removed utilizing a chemical etching process that selectively removes the gate dielectric 16. This etching step stops on an upper surface of the Si-containing substrate 12 as well as an upper surface of the isolation regions. Although any chemical etchant may be used in removing the exposed portions of the gate dielectric 16, in one embodiment dilute hydrofluoric acid (DHF) is used.

At this point of the present invention, an epitaxial Si-containing layer can be formed on the exposed portions of the Si-containing substrate that are not protected by the spacers to form raised S/D regions. The epitaxial Si-containing layer is not shown in the drawing for clarity.

Outer silicide contact 30 is then formed on the exposed Si-containing substrate 12 not protected by the spacers (or optionally on the epitaxially grown Si-containing layer) using a salicide process (self-aligned silicide process) which includes the steps of depositing a metal and an optional capping layer on an exposed surface of the Si-containing substrate 12, first annealing to form a silicide, selective etching any non-reacted metal including the capping layer if used and, if needed, performing a second annealing step. The resultant structure including the outer silicide contact 30 is shown, for example, in FIG. 1A. Note that each outer silicide contact 30 has an edge that is aligned to the outer edge of the wide spacer 26. Also, in embodiments when the gate conductor 18 is comprised of polysilicon and the dielectric capping layer is not located thereon, the salicidation process can also form a silicide contact 22 atop the gate conductor 18. This embodiment is depicted in FIG. 1A. The silicide contact 22 atop the gate conductor 18 is comprised of the same material and is of substantially the same thickness as that of outer silicide contact 30.

The metal used in forming the outer silicide contact 30 comprises any metal that is capable of reacting with silicon to form a metal silicide. Examples of such metals include, but are not limited to: Ti, Ta, W, Co, Ni, Pt, Pd and alloys thereof. In one embodiment, Co is a preferred metal. In such an embodiment, the second annealing step is required. In another embodiment, Ni or Pt is preferred. In this embodiment, the second annealing step is typically not performed.

The metal may be deposited using any conventional deposition process including, for example, sputtering, chemical vapor deposition, evaporation, chemical solution deposition, plating and the like.

The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The salicide anneals are carried out in a gas atmosphere, e.g., He, Ar, $N_2$ or forming gas (mixture of $H_2$ and $N_2$). The annealing steps may use different atmospheres or the annealing steps may be carried out in the same atmosphere. For example, He may be used in both annealing steps, or He can be used in the first annealing step and a forming gas may be used in the second annealing step.

In some embodiments, the outer silicide contact 30 can be formed by sputtering one of the above metals directly on the exposed Si-containing substrate 12. The sputtering process causes interaction and reaction between silicon and the sputtering metal forming a silicide contact. A selective etch can be used to remove any sputtered metal that does not form a silicide. This method can be used in forming the inner silicide contact as well.

As shown in FIG. 1A, the outer silicide contact 30 is a relatively thick contact in comparison to the inner silicide contact to be subsequently formed. The thickness of the outer silicide contact 30 is typically from about 10 to about 40 nm. More typically, the outer silicide contact 30 has a thickness from about 20 to about 30 nm. Because of the relatively thick nature of the outer silicide contact 30, the resistivity of the contact 30 is relatively low. By low resistivity, it is meant a resistivity of about 20 ohm/square or less.

Figure 1B:
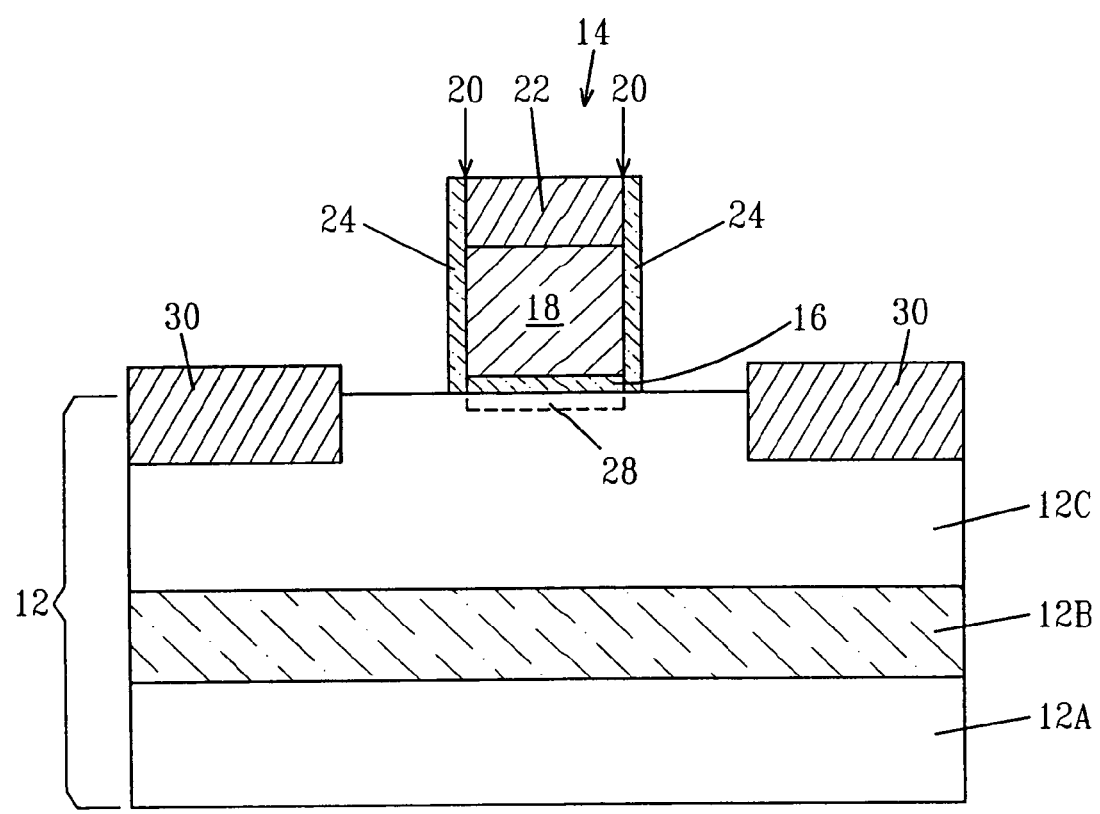

Next, and as shown in FIG. 1B, the wide spacer 26 is removed to expose underlying portions of the Si-containing substrate 12. If not previously present, the narrow inner spacer 24 can be formed after the wide spacer 26 has been removed. The wide spacer 26 is removed utilizing an etching process that has a high selectivity for removing wide spacer material as compared to either the gate conductor 18 or the narrow inner spacer 24. Specifically, the wide spacer 26 can be removed by a selective wet etch process in which phosphoric acid is used as a chemical etchant.

At this point of the present invention, and if not previously formed, optional halo implants and source/drain extensions can be formed by ion implantation and annealing. The ion implant and anneal conditions used in forming the optional halo implant and the source/drain extensions are well known to those skilled in the art. The optional halo implant and source/drain extensions are not specifically shown in the drawings of the present application.

Figure 1C:
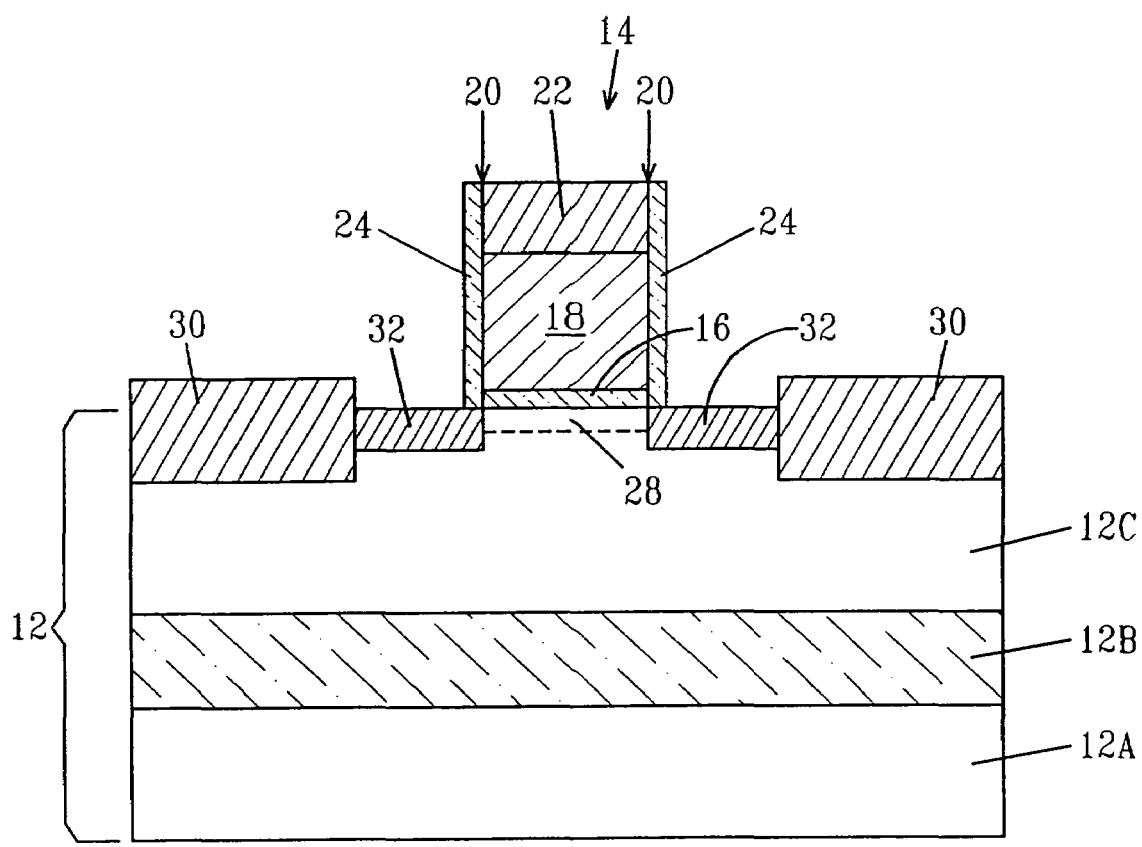

Next, and a shown in FIG. 1C, the inner silicide contact 32 is formed on the exposed portion of the Si-containing substrate 12. The inner silicide contact 32 can be comprised of the same or different metal silicide as the outer silicide contact 30. Moreover, the processing steps and conditions used in forming the outer silicide contact 30 including salicidation or direct sputtering is applicable for forming the inner silicide contact 32. Thus, the above description regarding contact formation is incorporated herein by reference. Note that during the formation of the inner silicide contact 32, a protective layer can be formed over the previously formed outer silicide contact 30. In some embodiments, in which the inner silicide contact 32 and the outer silicide contact 30 are composed of the same metal silicide, no protective layer is needed. TiN or TaN are examples of protective layers that can be used.

The inner silicide contact 32 is a relatively thin (as compared to the outer silicide contact 30 previously formed) layer whose thickness is typically from about 3 to about 20 nm, with a thickness from about 5 to about 10 nm being more typical. The inner silicide contact 32 is aligned on one side to the gate edge 20 as shown in FIG. 1C and the other side is aligned to the outer silicide contact 30. Because of the thinnest of the inner silicide contact 32, the resistivity of the contact is higher than that of the outer silicide contact 30.

Figure 1D:
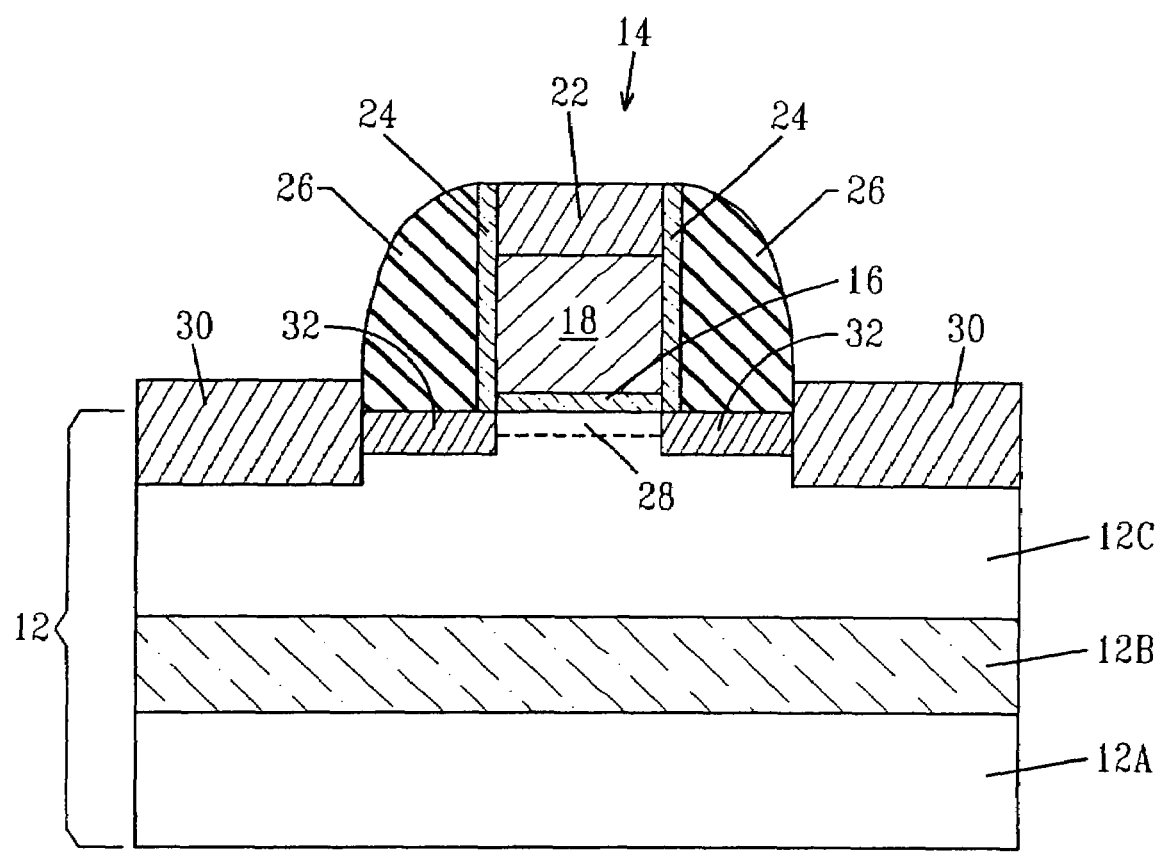

FIG. 1D shows the structure after reforming the wide spacer 26 on the surface of the now formed inner silicide contact 32. The wide spacer 26 is formed as described above. Note that the wide spacer 26 need not be reformed in all instances. Following the wide spacer 26 reformation, conventional BEOL (back-end-of-the-line) processing steps can be used to form one or more interconnect levels that include an interlevel dielectric that has conductively filled openings that extend to and contact at least the outer silicide contact 30 shown in FIG. 1D.

Figure 2:
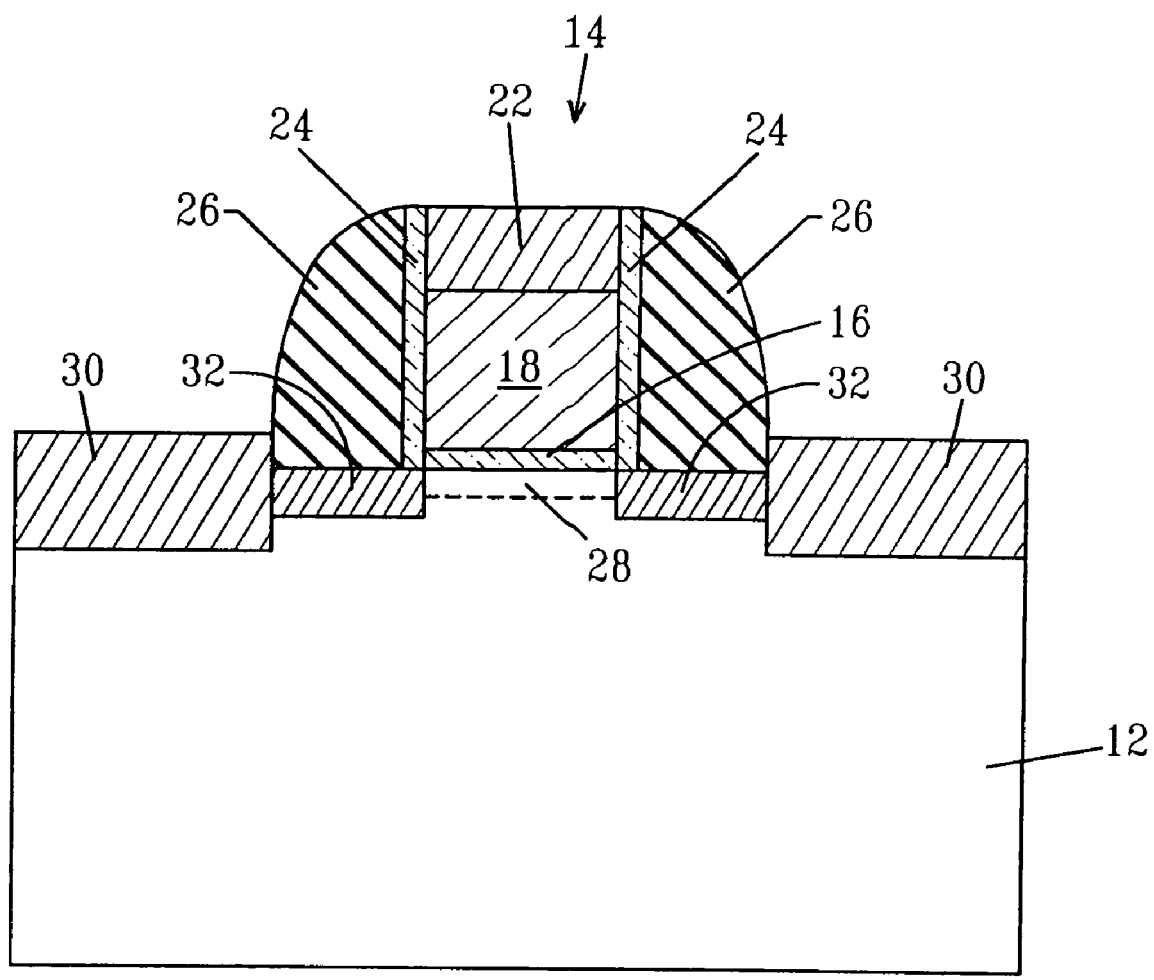
FIG. 2 is a pictorial representation (through a cross sectional view) illustrating a MOSFET structure of the present invention formed atop a bulk semiconductor substrate.

FIG. 2 illustrates an embodiment in which the initial substrate 12 is a bulk Si-containing substrate instead of an SOI substrate as is shown in FIGS. 1A–1D. The processing used in forming this structure is the same as described in either FIGS. 1A–1D above, or alternatively, as is described in FIGS. 3A–3B herein below.

Figure 3A:
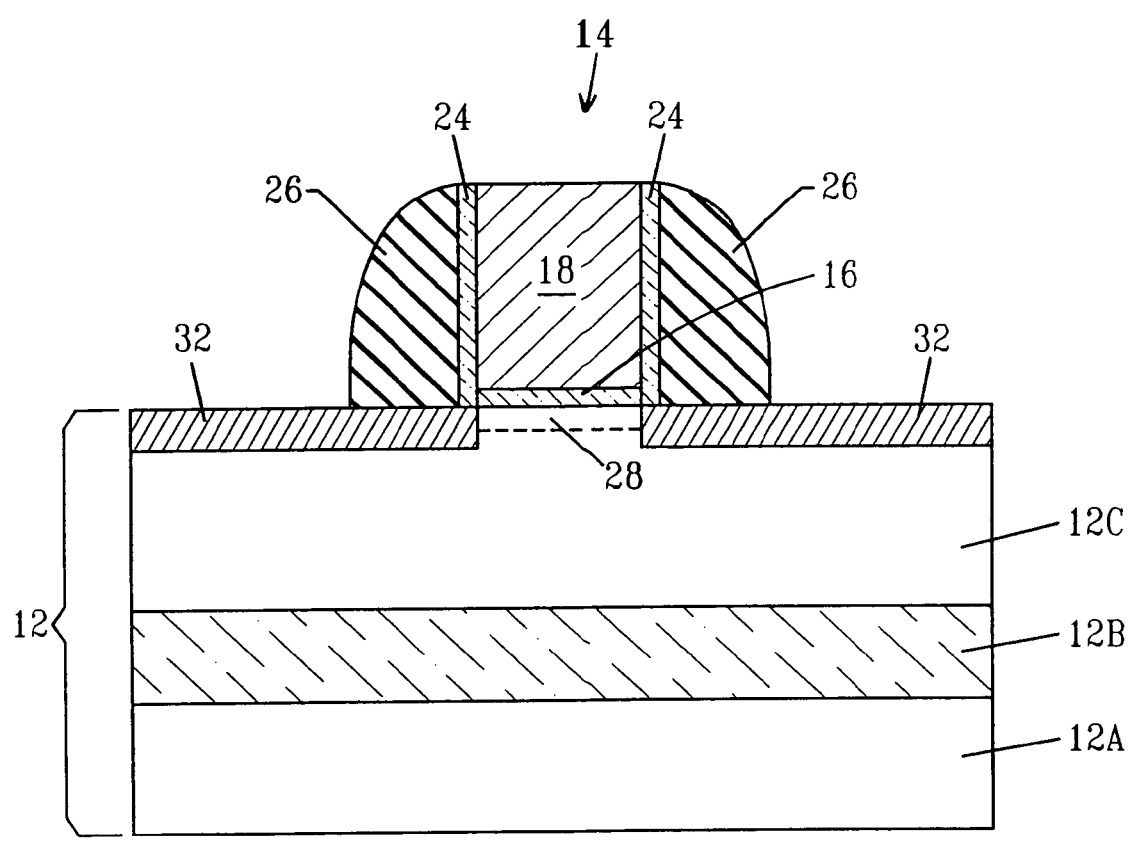
FIGS. 3A–3B are pictorial representations (through cross sectional views) illustrating the basic processing steps employed in a second embodiment of the present invention.
Figure 3B:
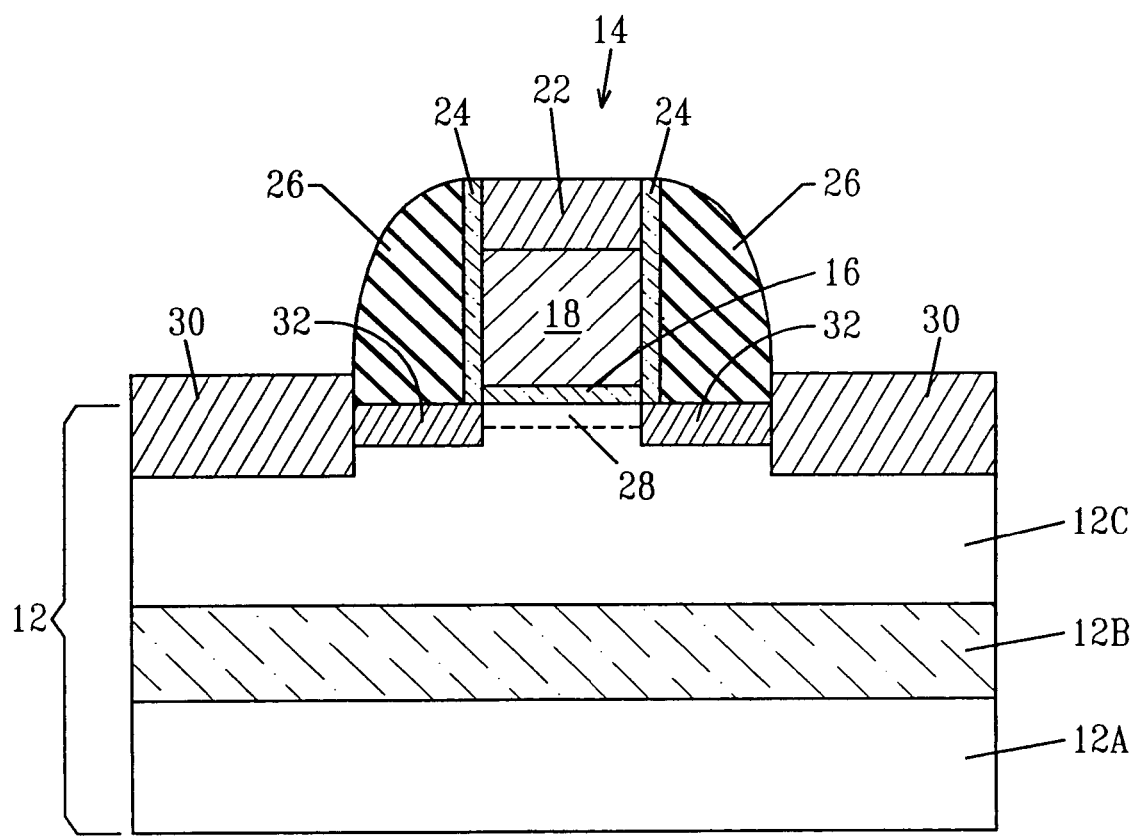

As stated above, the method shown in FIGS. 1A–1D forms the thick outer silicide contact 30 prior to forming the thinner inner silicide contact 32. FIGS. 3A–3B show the second method of the present invention in which the inner silicide contact 32 is formed first and then the outer silicide contact 30 is formed. The second method of the present invention begins by performing the steps mentioned in the first method of the present invention up to, and including, the patterning of the gate stack. After patterning of the gate stack, the narrow inner spacer 24 is formed on the exposed sidewall of the patterned gate stack utilizing the technique described above in the first embodiment of the present invention. Next, the inner silicide contact 32 is formed utilizing the processes mentioned above. Note that gate conductor 18 has not been silicided at this point of the present invention since a dielectric capping layer (not shown) is typically located on the gate conductor during salicidation of the inner silicide contacts 32. The structure shown in FIG. 3A is after the dielectric capping layer has been removed from atop the gate conductor 18.

A wide spacer 26, as described above, is then formed on the vertical sidewall surface of the narrow inner spacer 24 and atop a portion of the inner silicide contact 32. The resultant structure formed after the above processing steps have been performed is used shown, for example, in FIG. 3A.

Next, and as shown in FIG. 3B, an outer silicide contact 30 is formed directly atop a portion of the first inner silicide contact 32, or alternatively, the portion of the first inner silicide contact 32 can be removed utilizing a selective etching process stopping on an underlying surface of the Si-containing surface 12 and then the outer silicide contact 30 is formed thereon. The outer silicide contact 30 is formed utilizing the processing steps described in the first method of the present invention. If the upper surface of the gate conductor 18 is exposed and is comprised of polysilicon, an optional silicide gate contact 22 can be formed at this point of the present invention.

Like the first method, the second method of the present invention can work on bulk substrates instead of the SOI substrate shown in FIGS. 3A–3B.

Notwithstanding which of the methods are employed, it is preferred to form an outer silicide contact 30 comprised of silicides of Ni, Co or Pt and an inner silicide contact 32 comprised of silicides of Ni, Co or Pt. In one preferred embodiment, the inner silicide contact 32 is comprised of a silicide of Pt, while the outer silicide contact 30 is comprised of a silicide of Ni, Co or Pt, with Pt being highly preferred. In one preferred embodiment, the inner silicide contact 32 is comprised of a silicide of Ni, while the outer silicide contact 30 is comprised of a silicide of Ni, Co or Pt, with Ni being highly preferred. In one preferred embodiment, the inner silicide contact 32 is comprised of a silicide of Co, while the outer silicide contact 30 is comprised of a silicide of Ni, Co or Pt, with Co being highly preferred.

In the various embodiments of the present invention mentioned above, the metal employed in forming the silicide may include an alloying additive that can enhance the formation of a metal silicide. Examples of alloying additives that may be employed in the present invention include: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the metal used in forming the silicide. When present, the alloying additive is present in an amount from about 0.1 to about 50 atomic percent.

In yet other embodiments, the Si-containing substrate 12 is replaced with other types of semiconductor substrates such as Ge, InAs, or InP and the above processing steps are performed using a metal silicide that is capable of interacting with the other type of semiconductor material. Alternatively, a Si-containing layer can be formed atop the other types of semiconducting material prior to formation of the silicide contacts.

While the present invention has been particularly shown and described with respect to preferred embodiments thereof, it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

What we claim is:

1. A metal oxide semiconductor field effect transistor (MOSFET) structure that comprises:
   at least one metal oxide semiconductor field effect transistor located on a surface of a Si-containing substrate, said at least one metal oxide semiconductor field effect transistor comprises at least a gate conductor having a gate edge;
   a first inner silicide contact having an edge that is substantially aligned to the gate edge of the at least one metal oxide semiconductor field effect transistor, said first inner silicide contact having a first thickness and a first resistivity, wherein said inner silicide contact is not offset from said gate edge by a width of any overlying spacer; and
   a second outer silicide contact located adjacent to said first inner silicide contact, said second outer silicide contact having a second thickness and a second resistivity, wherein said second thickness is greater than the first thickness and second resistivity is lower than the first resistivity.

2. The MOSFET of claim 1 wherein said Si-containing substrate is replaced with another semiconductor material besides a Si-containing semiconductor material.

3. The MOSFET of claim 1 wherein said at least one metal oxide semiconductor field effect transistor further comprises a gate dielectric located beneath said gate conductor.

4. The MOSFET of claim 1 wherein said at least one metal oxide semiconductor field effect transistor further comprises at least one spacer on a vertical sidewall thereof.

5. The MOSFET of claim 4 wherein said at least one spacer comprises a single wide spacer or a spacer pair including a narrow inner spacer and a wide outer spacer.

6. The MOSFET of claim 1 wherein said first inner silicide contact comprises a silicide of Ti, Ta, W, Co, Ni, Pt, Pd or alloys thereof including alloys with an alloying additive.

7. The MOSFET of claim 6 wherein said first inner silicide contact comprises a silicide of Ni, Co or Pt.

8. The MOSFET of claim 1 wherein said first thickness of said first inner silicide contact is from about 3 to about 20 nm.

9. The MOSFET of claim 1 wherein said second outer silicide contact comprises a silicide of Ti, Ta, W, Co, Ni, Pt, Pd or alloys thereof including alloys with an alloying additive.

10. The MOSFET of claim 9 wherein said second outer silicide contact comprises a silicide of Ni, Co or Pt.

11. The MOSFET of claim 1 wherein said second thickness of said second outer silicide contact is from about 10 to about 40 nm.

12. The MOSFET of claim 1 wherein said second resistivity of said second outer silicide contact is about 20 ohm/square or less.

13. The MOFET of claim 1 wherein said Si-containing substrate is a bulk semiconductor material.

14. The MOSFET of claim 1 wherein said Si-containing substrate is a silicon-on-insulator material.

* * * * *